(12) United States Patent
Ochi

(10) Patent No.: US 6,469,943 B2
(45) Date of Patent: Oct. 22, 2002

(54) SWITCHING CIRCUIT AND SEMICONDUCTOR DEVICE

(75) Inventor: Takehiro Ochi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/912,537

(22) Filed: Jul. 26, 2001

(65) Prior Publication Data
US 2002/0097083 A1 Jul. 25, 2002

(30) Foreign Application Priority Data

Jan. 23, 2001 (JP) ........................................ 2001-015000

(51) Int. Cl.$^7$ ................................................ G11C 7/00
(52) U.S. Cl. ...................... 365/200; 365/201; 365/225.7
(58) Field of Search ................................. 365/200, 201, 365/225.7, 208, 212

(56) References Cited

U.S. PATENT DOCUMENTS

| | | | | | |
|---|---|---|---|---|---|
| 5,058,059 A | * | 10/1991 | Matsuo et al. | ................ | 326/10 |
| 5,258,953 A | * | 11/1993 | Tsujimoto | ................... | 365/200 |
| 5,337,277 A | * | 8/1994 | Jang | ........................... | 365/200 |
| 5,657,280 A | * | 8/1997 | Shin et al. | ................... | 365/200 |
| 5,699,306 A | * | 12/1997 | Lee et al. | .............. | 365/189.05 |
| 6,094,386 A | * | 7/2000 | Kohyama | .................... | 365/200 |
| 6,118,710 A | * | 9/2000 | Tsuji | .......................... | 365/200 |
| 6,144,592 A | * | 11/2000 | Kanda | ........................ | 365/200 |
| 6,188,618 B1 | * | 2/2001 | Takase | ....................... | 365/200 |

FOREIGN PATENT DOCUMENTS

| | | |
|---|---|---|
| JP | 62-235750 | 10/1987 |
| JP | 6-216253 | 8/1994 |
| JP | 9-213097 | 8/1997 |
| JP | 10-335594 | 12/1998 |

* cited by examiner

Primary Examiner—David Nelms
Assistant Examiner—Thong Le
(74) Attorney, Agent, or Firm—McDermott, Will & Emery

(57) ABSTRACT

A switching circuit between a main circuit and a redundant circuit in a semiconductor device is disclosed. The redundant circuit replaces the main circuit by blowing a fuse. But a nullifying means can nullify blowing of the fuse, if needed. A switching element connected in parallel with the fuse and a control means enable nullification. The control means turn on the switching element to ascertain whether nullification is effective, and fix the nullification by blowing a fuse in the control means.

9 Claims, 4 Drawing Sheets

| a0 | a1 | x0 | x1 | x2 | x3 |
|----|----|----|----|----|----|
| 0  | 0  | 1  | 0  | 0  | 0  |
| 1  | 0  | 0  | 1  | 0  | 0  |
| 0  | 1  | 0  | 0  | 1  | 0  |
| 1  | 1  | 0  | 0  | 0  | 1  |

SWITCHING CIRCUIT AND SEMICONDUCTOR DEVICE

BACKGROUND OF THE INVENTION

1. Field of the Invention

The present invention relates to a switching circuit in a semiconductor device, which enables switching from a main circuit to a redundant circuit in the semiconductor device.

2. Background Art

In recent years, ever-greater improvements in density and performance of an IC have been achieved. Moreover, manufacturing processes have also become more minute and precise. Hence, manufacture of a perfectly flawless IC is extremely difficult. For this reason, there has been implemented a method of fabricating a redundant circuit in an IC. If a defective circuit is detected in a test, a flawless redundant circuit will replace it. A replacement is usually implemented with a switching circuit having a fuse.

A switching circuit having a fuse is also used to tune the internal potential of a circuit to an optimal potential for a circuit operation.

FIG. 5 is a schematic diagram showing one example of a prior-art switching circuit.

As illustrated, reference numeral 1 designates a switching element for supplying an address selection signal to a gate terminal of the redundant circuit; and 2 designates a switching element for supplying a pre-charge signal to the gate terminal. A source terminal of the switching element 1 is grounded, and a drain terminal of the switching element 1 is connected to a source terminal of the switching element 2 by way of a fuse 3. The drain terminal of the switching element 1 is connected further with a power supply Vcc. A word line (WL) selection signal is supplied to a drain terminal of the switching element 4. The source terminal of the switching element 4 is connected to a redundant (spare) word line (hereinafter abbreviated as "WL").

Here, reference numeral 5 designates a switching element whose gate terminal is to be supplied with an address selection signal; and 6 designates a switching element whose gate terminal is to be supplied with a pre-charge signal. A source terminal of the switching element 5 is grounded, and a drain terminal of the switching element 5 is connected to a source terminal of the switching element 6 and further to a gate terminal of a switching element 8 by way of an inverter 7.

A drain terminal of the switching element 6 is connected to a power source Vcc, and a WL selection signal is supplied to a drain terminal of the switching element 8. A source terminal of the switching element 6 is connected to a main WL. Reference numeral 9 designates a switching element whose gate terminal is connected to a gate terminal of the switching element 4. A drain terminal of the switching element 9 is connected to a gate terminal of the switching element 8. Further, a source terminal of the switching element 8 is grounded.

The operation of the switching circuit will now be described.

When an address selection signal is input to the switching elements 1 and 5, either a main WL for effecting read/write of a main cell or a spare WL for effecting read/write of a spare cell is selected. In an initial state of the redundant circuit, the pre-charge signal is input to the switching elements 2 and 6, thereby turning on the switching elements 2 and 6. As a result, nodes N1 and N2 enter a high level "H."

When the redundant circuit is not used, the fuse 3 remains unblown and as is. When an address selection signal is input, the switching elements 1 and 5 are turned on, and a current flows to GND, whereupon the nodes N1 and N2 enter a low level "L." In this state, the switching element 4 is turned off, and the WL selection signal does not enter the spare WL. In this state, the switching element 9 also remains in an OFF state, and hence a node N3 enters a high level "H." Further, the switching element 8 is turned on. As a result, the WL selection signal enters a main WL, and a corresponding main cell is selected.

When the redundant circuit is used, the fuse 3 is blown. When an address selection signal is input, the switching elements 1 and 5 are turned on. The node N2 enters a low level "L," and the node N1 remains in a high level "H" as a result of the fuse 3 having been blown. Since the node N1 is in a high level "H," the switching element 4 is turned on, and the WL selection signal enters a spare WL, thereby selecting a corresponding spare cell. In contrast, the switching element 9 is turned on as a result of the node N1 remaining in a high level "H," and the node N3 enters a low level "L." As a result, the switching element 8 is turned off, and the WL selection signal does not enter the main WL. Thus, a corresponding main cell is not selected.

In the prior-art circuit, once the fuse is blown for switching, the circuit cannot be restored to its original state. Therefore, if a redundant circuit is found to be defective after the fuse is blown, a semiconductor device including the redundant circuit must be taken as defective.

SUMMARY OF THE INVENTION

The purpose of the present invention is to provide a new switching circuit between a main circuit and a redundant circuit in a semiconductor device, which enable to nullify switching after blowing a fuse.

According to one aspect of the present invention, a switching circuit comprises one-way-switching means, for example a fuse, to switch from the main circuit to the redundant circuit. And the switching circuit also comprises nullifying means to nullify switching by the one-way-switching means.

The nullifying means may comprise a switching element, such as a transistor switch, connected in parallel with the one-way-switching means, and a control means to control the switching element. The control means may operate to tentatively turn on the switching element in a test mode to enable to ascertain whether a nullification of switching by the one-way-switching element is effective or not. The control means preferably has a fuse to be blown to fix the switching element ON, that is, to fix the nullification.

Other and further objects, features and advantages of the invention will appear more fully from the following description.

DETAILED DESCRIPTION OF THE PREFERRED EMBODIMENTS

Figure 1:
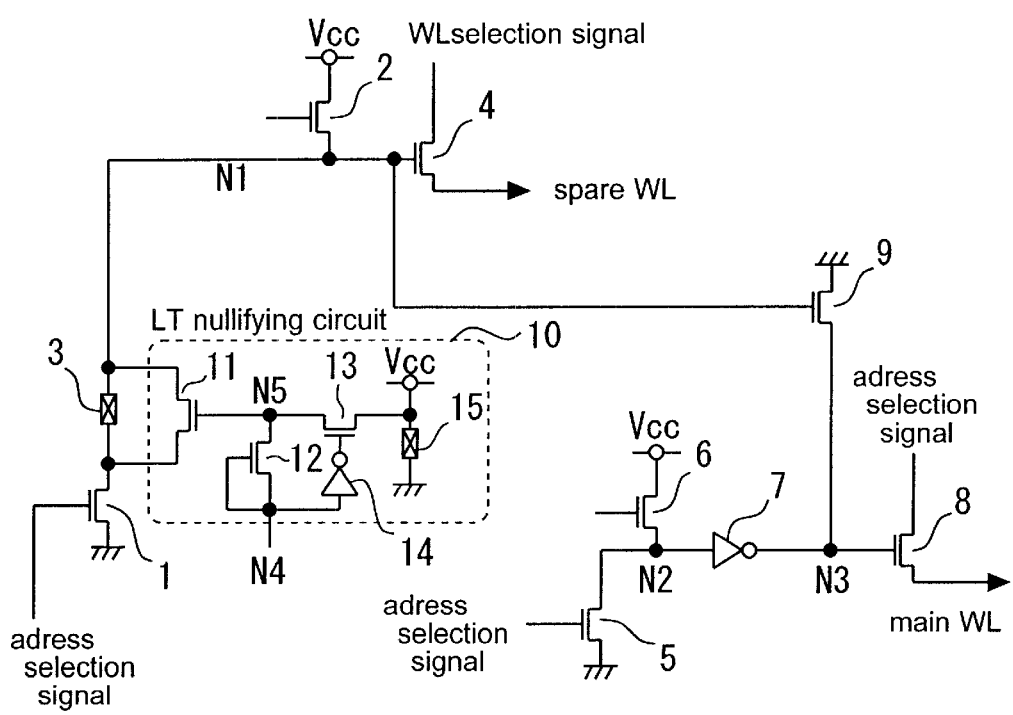
FIG. 1 is a circuit diagram showing a switching circuit according to a first embodiment of the present invention.
Figure 5:
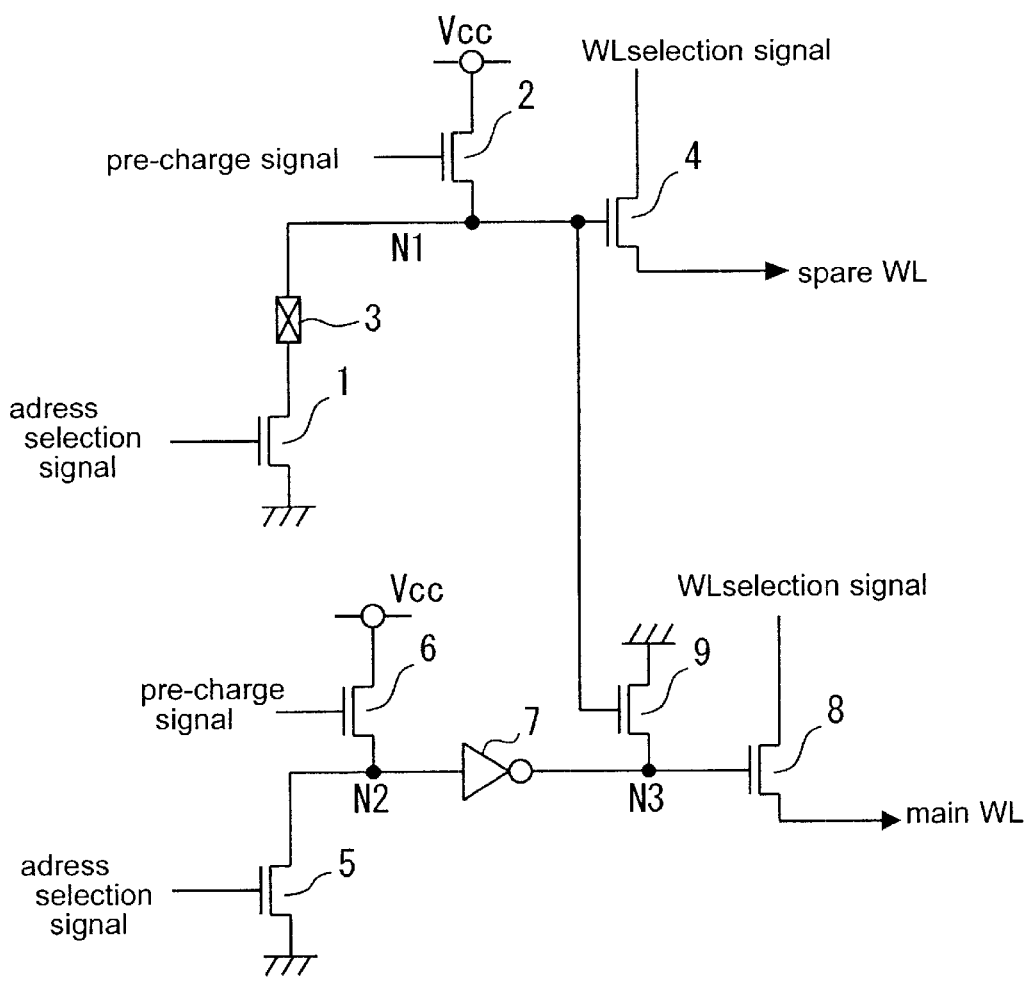
FIG. 5 is a schematic diagram showing one example of a prior-art switching circuit.

Embodiments of the present invention will be described hereinbelow with reference to the accompanying drawings while the case of a semiconductor memory device to which the present invention is applied is taken as an example.
First Embodiment FIG. 1 is a circuit diagram showing a switching circuit according to a first embodiment of the present invention. In FIG. 1, elements which are the same as those shown in FIG. 5 are assigned the same reference numerals, and repetition of their detailed explanations is omitted.

As shown in FIG. 1, reference numeral 10 designates a laser trimming (abbreviated as "LT") nullifying circuit serving as nullifying means which nullifies the laser trimming. The laser trimming nullifying circuit 10 has switching elements 11 through 13, an inverter 14, and a fuse 15. A drain terminal and a source terminal of the switching element 11 are connected across a fuse 3 (one-way-switching means). Further, a gate terminal of the switching element 11 is connected to a power source side of a fuse 15 connected between a power source Vcc and GRD, by way of a node N5 and a switching element 13.

A drain terminal and a gate terminal of the switching element 12 are connected commonly to a node N4 to which a test mode signal is to be supplied. A source terminal of the switching element 12 is connected to a node N5. The node N4 is connected to a gate terminal of a switching element 13 by way of an inverter 14. In the LT nullifying circuit 10, constituent elements other than the switching element 11 are constituted as control means for controlling the operation of the switching element 11.

The operation of the switching circuit will be described. Here, the operation of the switching circuit other than the operation of the LT nullifying circuit 10 is identical with that of the switching circuit shown in FIG. 5. Hence, explanations of operation of the switching circuit are omitted here.

Blowing of the fuse 3 is nullified by means of turning on the switching element 11, thereby enabling the switching circuit to return to its original state before laser trimming has been effected. The ON/OFF state of the switching element 11 is controlled by means of an "H" or "L" signal level of the node N5. In order to control the signal level of the node N5, the fuse 15 and the node N4 are provided. The node N4 is controlled in a test mode. When the LT nullifying circuit 10 is not used, the node N4 is set to a low level "L."

If nullifying of blowing of the fuse 3 is desired after the fuse 3 is blown, the switching circuit is set to a test mode, thereby bringing the node N4 to a high level "H." As a result, a switching element 12 is turned on, and a switching element 13 is turned off, whereupon the node N5 enters a high level "H." Further, the switching element 11 is turned on, thereby nullifying blowing of the fuse 3. The fuse 15 and the power source Vcc is substantially cut off from the switching elements 11 and 12, by means of reversing the high level "H" of the node N4 through an inverter 14 and applying a low-level "L" signal to a gate terminal of the inverter 14, thereby turning off the switching element 13. A test is effected in this state, thereby determining whether to nullify blowing of the fuse 3.

Finally, when nullifying of blowing of the fuse 3 is desired, the fuse 15 of the LT nullifying circuit 10 is blown. At this time, the node N4 remains in a low level "L," and hence the node N5 is switched to a high level "H," thereby turning on the switching element 11. Blowing of the fuse 3 can be nullified by means of blowing the fuse 15. When switching of a memory cell in an X direction is desired to be changed to relief of a memory cell in a Y direction, use of the LT nullifying circuit 10 enables more appropriate operation.

Figure 2:
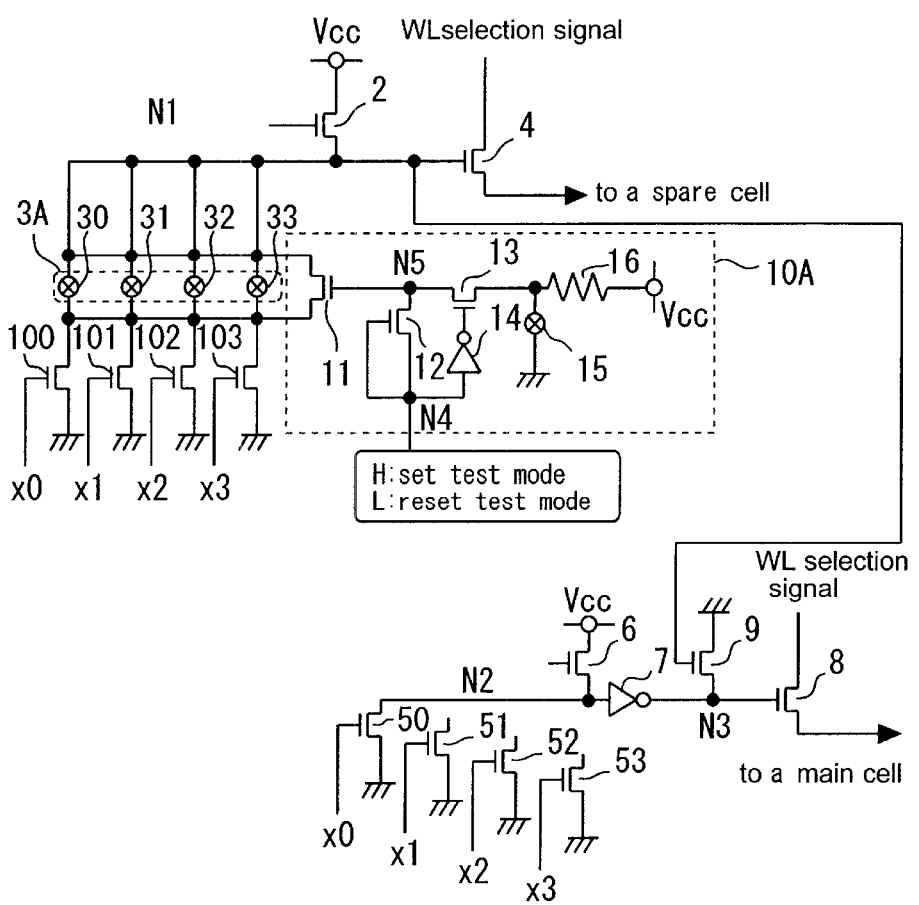
FIG. 2 is a circuit diagram showing a switching circuit according to a second embodiment.

As mentioned above, in the present embodiment, a switching circuit is provided with an LT nullifying circuit to be used when nullifying of blowing of a fuse effected at the time of use of a redundant circuit is desired. If a found defect in a test after switching is a relievable one, another appropriate operation relieves the semiconductor device from being defectives, and as a result contributing to an improvement in product yield.
Second Embodiment FIG. 2 is a circuit diagram showing a switching circuit according to a second embodiment of the present invention. In FIG. 1, elements which are the same as those shown in FIG. 2 are assigned the same reference numerals, and repetition of their detailed explanations is omitted.

As illustrated, reference numeral 3A designates a fuse box in which a plurality of fuses 30 through 33 are connected in parallel with each other. Terminals provided at one end of the respective fuses 30 through 33 are connected commonly to a node N1. Terminals provided at the other end of the respective fuses 30 through 33 are grounded by way of drain and source terminals of corresponding switching elements 100 through 103.

Figures 3, 4:
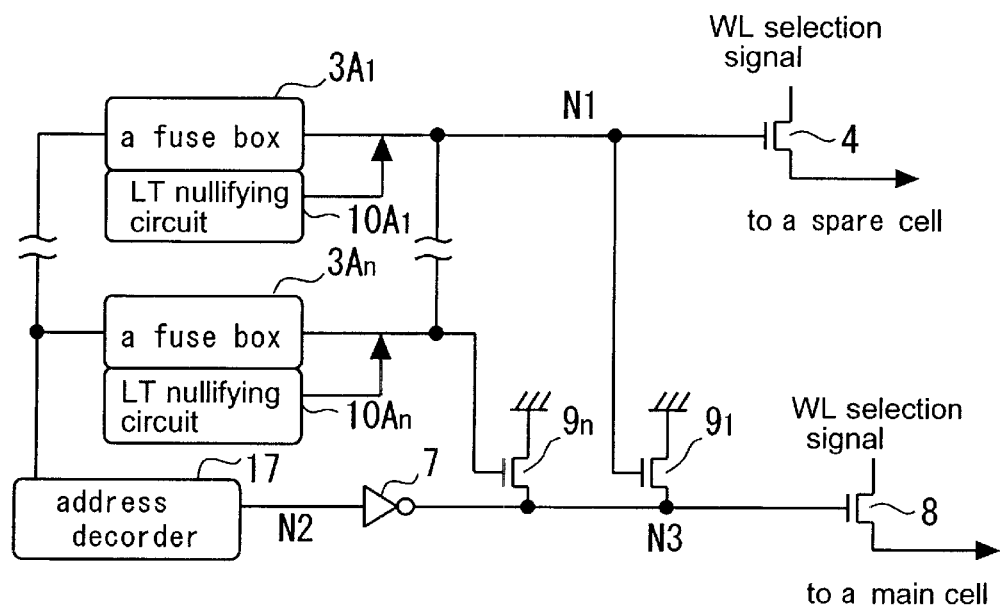
FIG. 3 is an address table used in a second embodiment.
FIG. 4 is a circuit diagram showing a switching circuit according to a third embodiment.

As shown in FIG. 3, an address selection signal x0 is input to a gate terminal of the switching element 100; an address selection signal x1 is input to a gate terminal of the switching element 101; an address selection signal x2 is input to a gate terminal of the switching element 102; and an address selection signal x3 is input to a gate terminal of the switching element 103. In the present embodiment, the plurality of address selection signals x0 through x3 are connected commonly to a single node N1 connected to a gate terminal of a switching element 4. An output terminal of the switching element 4 is connected to a spare cell.

A drain terminal and a source terminal of a switching element 11 of the LT nullifying circuit 10A are placed across the fuses 30 through 33. A gate terminal of the switching element 11 is connected to the power supply Vcc by way of a node N5, a switching element 13, and a resistor 16. The LT nullifying circuit 10A is identical in circuit configuration with the LT nullifying circuit 10, except for addition of the resistor 16.

A switching element 50 corresponding to the switching element 5 shown in FIG. 1 is provided:between the node N2 and ground. The address selection signal x0 is input to a gate terminal of the switching element 50. Similarly, switching elements 51 through 53 are connected between the node N2 and ground, wherein the address selection signal x1 is input to a gate terminal of the switching element 51, the address selection signal x2 is input to a gate terminal of the switching element 52, and the address selection signal x3 is input to a gate terminal of the switching element 53. A line which corresponds to the node N2 and is connected to drain terminals of the respective switching elements 51 through 53 is omitted.

An output side of the switching element 8 whose gate terminal is connected to the node N3 is connected to a main cell. In other respects, the LT nullifying circuit 10A is identical with in configuration with the LT nullifying circuit 10 shown in FIG. 1.

The operation of the LT nullifying circuit 10A will now be described.

The address selection signal x0 is input to the switching elements 50 and 100; the address selection signal x1 is input to the switching elements 51 and 101; the address selection signal x2 is input to the switching elements 52 and 102; and the address selection signal x3 is input to the switching elements 53 and 103. As shown in FIG. 3, each of the address selection signals x0 through x3 is composed of two bits of address signals a0 and a1. When the address signals a0 and a1 assume "00," the switching elements 50 and 100 are selected. When the address signals a0 and a1 assume "10," the switching elements 51 and 101 are selected. When the address signals a0 and a1 assume "01," the switching elements 52 and 102 are selected. When the address signals a0 and a1 assume "11," the switching elements 53 and 103 are selected.

Selection of either a main WL for effecting read/write of a main cell or a spare WL for effecting read/write of a spare cell is effected, by means of inputting the address selection signals x0 through x3 into the switching elements 50 through 53 and the switching elements 100 through 103 in a manner identical with that described in connection with the first embodiment.

The LT nullifying circuit 10A is substantially identical with that of the LT nullifying circuit 10 described in connection with the first embodiment. In the present embodiment, the switching element 11 is connected in parallel with the fuses 30 through 33 provided in the fuse box 3A. Hence, nullification of the fuses 30 through 33 is performed simultaneously by means of turning on or off the switching element 11 connected to the fuses 30 through 33.

In the present embodiment, a plurality of fuses connected to a spare cell are turned on or off simultaneously. Hence, a plurality of switching operations are corrected simultaneously, thereby contributing to an improvement in product yield and productivity.

Third Embodiment

FIG. 4 is a circuit diagram showing a switching circuit according to a third embodiment of the present invention. In FIG. 4, elements which are the same as those shown in FIGS. 1 and 3 are assigned the same reference numerals, and repetition of their detailed explanations is omitted.

In the present embodiment, a plurality of fuse boxes are disposed. When nullifications of more than one fuse are needed, the entire fuse box including the fuses is nullified and the next fuse box is subjected to desired LT.

In the illustrations, reference numerals 3A1 through 3A$n$ designate fuse boxes having the same configuration as that of the fuse box 3A. The fuse boxes 3A1 through 3A$n$ are provided respectively with LT nullifying circuits 10A$_1$ through 10A$_n$ analogous to the LT nullifying circuit 10A shown in FIG. 2. Terminals provided at one end of the fuse boxes 3A$_1$ through 3A$_n$ are connected to the gate terminal of the switching element 4. A plurality of switching elements 9$_1$ through 9$_n$ analogous to the switching element 9 shown in FIG. 2 are provided for the fuse boxes 3A$_1$ through 3A$_n$. Source terminal of the respective switching elements 9$_1$ through 9$_n$ are grounded, and drain terminals of the same are connected to the node N3.

An address decoder 17 including a circuit substantially corresponding to the switching elements 50 through 53 and 100 through 103 is interposed between the node N2 and the fuse boxes 3A$_1$ through 3A$_n$.

The operation of the switching circuit will now be described.

Here, the node N1 for selecting a spare WL of a spare cell and the node N2 for selecting the main WL of a main cell are in an initial state; that is, a high level state "H." Here, when an address selection signal is input from the address decoder 11, relief information about a fuse box which does not use any LT nullifying circuit is reflected on the relief operation of the switching circuit. Here, the node N1 is set to a high level "H," and the node N2 is set to a low level "L." Since the node N1 is in a high level "H," the switching element 4 is turned on, so that the spare WL is turned on.

Further, the node N1 is in a high level "H," and the switching element 9 is turned on. The switching element 8 is turned off, so that the main WL is turned off.

In the present embodiment, laser trimming is effected while the LT nullifying circuits are connected in parallel with each other. Further, LT information about a fuse box which does not use any LT nullifying circuit is reflected in the relief operation of the switching circuit, thus further contributing to an improvement in product yield and productivity.

Through the foregoing embodiments, an explanation has been given of a case where the present invention is applied to a semiconductor memory device. However, the present invention is not limited to these embodiments and can be applied to other types of semiconductor devices in the same manner. Thus, there are yielded the same advantages as those yielded in the previous embodiments.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No.2001-015000, filed on Jan. 23, 2001 including specifications, claims drawings and summary, on which the Convention priority of the present application is based, are incorporated herein by reference in its entirety.

What is claimed is:

1. A switching circuit between a main circuit and a redundant circuit in a semiconductor device comprising:

one-way-switching means configured to switch from an original operation by switching the main circuit to the redundant circuit; and nullifying means configured to nullify switching by the one-way-switching means restoring the switching circuit to the original operation.

2. The switching circuit according to claim 1, wherein the semiconductor device is a memory device having a main cell as said main circuit and a redundant,cell as said redundant circuit.

3. The switching circuit according to claim 1, wherein the nullifying means comprises a switching element connected in parallel with the one-way-switching means; and a control means to control the switching element.

4. The switching circuit according to claim 3, wherein the control means operates to tentatively turn on the switching element in a test mode to enable to ascertain whether nullification of switching by the one-way-switching element is effective or not.

5. The switching circuit according to claim 3, wherein the control means has a fuse to be blown to fix the switching element ON.

6. The switching circuit according to claim 1, wherein the one-way-switching means includes a plurality of one-way-switching means assigned for the redundant circuit, and the nullifying means simultaneously nullifies switching by any of the plurality of one-way-switching means.

7. The switching circuit according to claim 6, wherein the nullifying means includes a plurality of nullifying means, and a set of one-way-switching means is assigned to each of the plurality of nullifying means.

8. The switching circuit according to claim 1, wherein the one-way-switching means is a circuit including a fuse.

9. A semiconductor device including the switching circuit defined in claim 1.

* * * * *